United States Patent
Chen et al.

(10) Patent No.: US 12,464,885 B2
(45) Date of Patent: Nov. 4, 2025

(54) LIGHT EMITTING DEVICE, DISPLAY SUBSTRATE AND DISPLAY EQUIPMENT

(71) Applicant: BOE Technology Group Co., Ltd., Beijing (CN)

(72) Inventors: Lei Chen, Beijing (CN); Xueqin Chen, Beijing (CN); Yuqian Sun, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1006 days.

(21) Appl. No.: 17/512,547

(22) Filed: Oct. 27, 2021

(65) Prior Publication Data
US 2022/0320451 A1    Oct. 6, 2022

(30) Foreign Application Priority Data
Mar. 23, 2021 (CN) .......................... 202110308623.5

(51) Int. Cl.
| | |
|---|---|
| *H10K 50/18* | (2023.01) |
| *H10K 50/11* | (2023.01) |
| *H10K 50/13* | (2023.01) |
| *H10K 50/15* | (2023.01) |
| *H10K 50/16* | (2023.01) |
| *H10K 50/17* | (2023.01) |
| *H10K 101/40* | (2023.01) |

(52) U.S. Cl.
CPC .......... *H10K 50/11* (2023.02); *H10K 50/13* (2023.02); *H10K 50/15* (2023.02); *H10K 50/16* (2023.02); *H10K 50/17* (2023.02); *H10K 50/171* (2023.02); *H10K 50/18* (2023.02); *H10K 50/181* (2023.02); *H10K 2101/40* (2023.02)

(58) Field of Classification Search
CPC . H01L 51/5004; H01L 51/504; H01L 51/056; H01L 51/5072; H01L 51/5096; H01L 51/5088; H01L 51/5092
See application file for complete search history.

(56) References Cited

U.S. PATENT DOCUMENTS

2019/0386234 A1* 12/2019 Cheng ................. H10K 59/12
2024/0188318 A1*  6/2024 Zhang ................. H10K 85/00

FOREIGN PATENT DOCUMENTS

| CN | 110931649 A | * | 3/2020 | ......... H01L 27/3244 |
|---|---|---|---|---|
| CN | 111613547 A | * | 9/2020 | ............. H01L 22/14 |

OTHER PUBLICATIONS

CN202110308623.5 first office action.

* cited by examiner

*Primary Examiner* — Michael B Cleveland
(74) *Attorney, Agent, or Firm* — IPro, PLLC

(57) ABSTRACT

The present disclosure provides a light emitting device, a display substrate and a display equipment. The light emitting device includes a hole injection layer, a hole transport layer, an electron blocking layer, a light emitting layer and an electron injection layer that are stacked in sequence; the light emitting layer includes a plurality of light emitting units, and the wavelengths of lights emitted by at least two of the plurality of light emitting units are different from each other; a hole mobility of the electron blocking layer is greater than or equal to a hole mobility of the hole injection layer or the hole transport layer; and a square resistance of the hole injection layer and a square resistance of the hole transport layer are both greater than or equal to $5 \times 10^{10}$ Ω/sq.

20 Claims, 2 Drawing Sheets

LIGHT EMITTING DEVICE, DISPLAY SUBSTRATE AND DISPLAY EQUIPMENT

CROSS-REFERENCE TO RELATED APPLICATION

This application claims a priority to Chinese Patent Application No. 202110308623.5 filed on Mar. 23, 2021, the disclosures of which are incorporated in their entirety by reference herein.

TECHNICAL FIELD

The present disclosure relates to the field of display technology, in particular, to a light emitting device, as well as a display substrate and a display equipment including the same.

BACKGROUND

In recent years, an organic light emitting diode display (OLED) as a new type of flat panel display technology has gradually received more attention. Because OLED has the characteristics of active light emission, high luminous brightness, high resolution, wide viewing angle, fast response speed, low energy consumption and flexibility, and thus OLED has become a hot mainstream display product in the current market. With the continuous development of display products, customers have requirements for display products with increasing high resolution and decreasing power consumption. Therefore, there is a need to develop a low-voltage, high-efficiency, and long-life light emitting device.

At present, in order to optimize the voltage and carrier injection of light emitting devices in display products, p-type doped materials are used as the material of the functional layer. Functional layers (for example, hole transport layers) composed of p-type doped materials are commonly used for pixels of red, green and blue three colors (RGB). Therefore, when the OLED light emitting device is energized, a lateral drift of current will occur. This causes faint R pixels to emit light at low gray levels (for example, in the case of a pure-color G pixel working), that is, it causes a problem of color crosstalk.

SUMMARY

In a first aspect, the present disclosure provides a light emitting device, including a hole injection layer, a hole transport layer, an electron blocking layer, a light emitting layer and an electron injection layer that are stacked in sequence, in which the light emitting layer includes a plurality of light emitting units, and the wavelengths of lights emitted by at least two of the plurality of light emitting units are different from each other; in which a hole mobility of the electron blocking layer is greater than or equal to a hole mobility of the hole injection layer or the hole transport layer; and in which a square resistance of the hole injection layer and a square resistance of the hole transport layer are both greater than or equal to $5\times10^{10}$ Ω/sq.

Optionally, the square resistance of the hole injection layer and the square resistance of the hole transport layer are both in a range from $5\times10^{10}$ Ω/sq to $5\times10^{11}$ Ω/sq.

Optionally, the square resistance of the hole injection layer and the square resistance of the hole transport layer are both in a range from $5\times10^{10}$ Ω/sq to $2\times10^{11}$ Ω/sq.

Optionally, the plurality of light emitting units includes a first light emitting unit and a second light emitting unit, and a wavelength of the light emitted by the first light emitting unit is less than a wavelength of the light emitted by the second light emitting unit; in which the hole mobility of the hole injection layer is equal to the hole mobility of the hole transport layer and is the first hole mobility, a hole mobility of a region of the electron blocking layer corresponding to the first light emitting unit is a second hole mobility, a hole mobility of a region of the electron blocking layer corresponding to the second light emitting unit is a third hole mobility, a ratio of the second hole mobility to the first hole mobility is a first ratio, a ratio of the third hole mobility to the first hole mobility is a second ratio, and the first ratio is greater than the second ratio.

Optionally, the first ratio is greater than 1 and less than or equal to 100, and the second ratio is greater than 1 and less than or equal to 11.

Optionally, the first ratio is in a range from 50 to 100, and the second ratio is in a range from greater than 2 to 10.

Optionally, the plurality of light emitting units further includes a third light emitting unit, and a wavelength of the light emitted by the second light emitting unit is less than a wavelength of the light emitted by the third light emitting unit; in which a hole mobility of a region of the electron blocking layer corresponding to the third light emitting unit is a fourth hole mobility, a ratio of the fourth hole mobility to the first hole mobility is a third ratio, and the second ratio is greater than the third ratio.

Optionally, the first ratio is greater than 1 and less than or equal to 100, the second ratio is greater than 1 and less than or equal to 11, and the third ratio is in a range from 1 to 10.

Optionally, the first ratio is in a range from greater than 50 to 100, the second ratio is in a range from 2 to 10, and the third ratio is in a range from 2 to 8.

Optionally, the first light emitting unit has a blue light emitting material, the second light emitting unit has a green light emitting material, and the third light emitting unit has a red light emitting material.

Optionally, the hole mobility of the hole injection layer and the hole mobility of the hole transport layer are both in a range from $5\times10^{-4}$ cm²/Vs to $5\times10^{-5}$ cm²/Vs.

Optionally, the light emitting device further includes an electron transport layer located between the light emitting layer and the electron injection layer.

Optionally, the light emitting device further includes a hole blocking layer located between the light emitting layer and the electron transport layer.

In a second aspect, the present disclosure provides a display substrate, including the above light emitting device.

In a third aspect, the present disclosure provides a display equipment, including the above display substrate.

In the light emitting device of the present disclosure, the light emitting layer includes at least two light emitting units that emit light of different wavelengths. The square resistance of the hole injection layer and the square resistance of the hole transport layer are both greater than or equal to $5\times10^{10}$ Ω/sq, so that the lateral current of the hole injection layer and the hole transport layer is reduced, thereby solving the problem of color crosstalk between the light emitting units. Further, an electron blocking layer is arranged between the hole transport layer and the light emitting layer, so that electrons can be blocked; and the hole mobility of the electron blocking layer is greater than or equal to the hole mobility of the hole injection layer and the hole mobility of the hole transport layer, so that the problem of high voltage can be protected, thereby ensuring the performance of the light emitting device.

DETAILED DESCRIPTION

The technical solutions in the embodiments of the present disclosure will be described hereinafter in conjunction with the drawings in the embodiments of the present disclosure in a clear and complete manner. Obviously, the following embodiments are merely a part of, rather than all of, the embodiments of the present disclosure.

The light emitting device provided by the embodiments of the present disclosure will be described in detail below.

Figure 2:
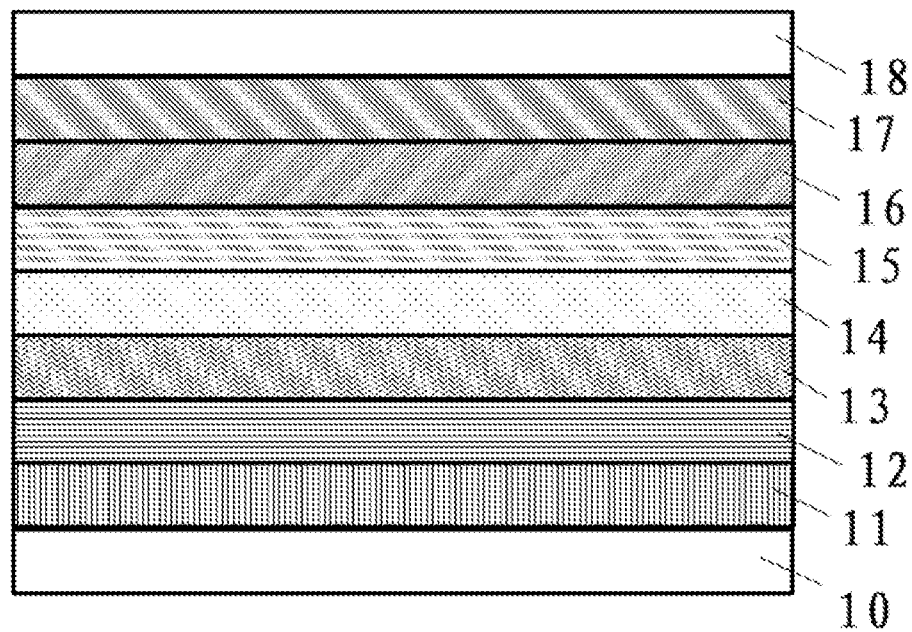
FIG. 2 is a schematic view showing the structure of a light emitting device according to an embodiment of the present disclosure.

As shown in FIG. 2, the light emitting device according to the embodiment of the present disclosure includes a hole injection layer 11, a hole transport layer 12, an electron blocking layer 13, a light emitting layer 14, and an electron injection layer 17 that are stacked in sequence. The light emitting layer 14 includes a plurality of light emitting units, and the wavelengths of lights emitted by at least two of the plurality of the light emitting units are different from each other, for example, the light emitting layer 14 may include a light emitting unit that emits blue light, a light emitting unit that emits green light, and a light emitting unit that emits red light. The hole mobility of the electron blocking layer 13 can be greater than or equal to the hole mobility of the hole injection layer 11 and the hole mobility of the hole transport layer 12, so that the problem of high voltage can be prevented, thereby ensuring the light emitting performance of the light emitting device. The hole mobility here is the mobility in the thickness direction of the electron blocking layer 13. The square resistance of the hole injection layer 11 and the square resistance of the hole transport layer 12 are both greater than or equal to $5 \times 10^{10}$ Ω/sq, optionally in a range from $5 \times 10^{10}$ Ω/sq to $5 \times 10^{11}$ Ω/sq, further optionally in a range from $5 \times 10^{10}$ Ω/sq to $2 \times 10^{11}$ Ω/sq, thereby reducing the lateral current of the hole injection layer and the hole transport layer.

In the light emitting device according to the above embodiment, the light emitting layer 14 includes at least two light emitting units that emit light of different wavelengths. The electron blocking layer 13 is arranged between the hole transport layer 12 and the light emitting layer 14, so that electrons can be blocked. The hole mobility of the blocking layer 13 is greater than or equal to the hole mobility of the hole injection layer 11 or the hole transport layer 12, so that the problem of high voltage can be prevented, thereby ensuring the light emitting performance of the light emitting device. In addition, the square resistance of the hole injection layer 11 and the square resistance of the hole transport layer 12 are both greater than or equal to $5 \times 10^{10}$ Ω/sq, so that the lateral current of the hole injection layer and the hole transport layer can be reduced, thereby solving the problem of color crosstalk between the light emitting units.

In some embodiments, the plurality of light emitting units may include a first light emitting unit and a second light emitting unit. The wavelength of the light emitted by the first light emitting unit is less than the wavelength of the light emitted by the second light emitting unit. For example, the first light emitting unit may be a blue light emitting unit, and the second light emitting unit may be a green light emitting unit. The hole mobility of the hole injection layer 11 is equal to the hole mobility of the hole transport layer 12, and used as the first hole mobility; the hole mobility of a region of the electron blocking layer 13 corresponding to the first light emitting unit is the second hole mobility; the hole mobility of a region of the electron blocking layer 13 corresponding to the second light emitting unit is the third hole mobility. The ratio of the second hole mobility to the first hole mobility is the first ratio, the ratio of the third hole mobility to the first hole mobility is the second ratio, and the first ratio is greater than the second ratio. The requirements for the mobility of the electron blocking layer 13 corresponding to the light emitting units of different colors are also different. By setting different hole mobility in different regions of the electron blocking layer 13, the voltage of the light emitting units of different colors can be optimized while further improving the color lateral crosstalk, thereby preventing the voltage from being too high, and keeping the voltage of the light emitting device stable.

In some embodiments, the first ratio A1 can be greater than 1 and less than or equal to 100, and the second ratio A2 can be greater than 1 and less than or equal to 11. Optionally, the first ratio A1 may be in a range from 50 to 100, and the second ratio may be in a range from 2 to 8. Further optionally, the first ratio A1 may be in a range from 55 to 95, and the second ratio may be in a range from 3 to 7. The specific first ratio and second ratio can be selected according to actual conditions. The material of the electron blocking layer 13 may be a compound containing an arylamine group. Optionally, the material of the electron blocking layer 13 corresponding to the light emitting devices emitting light with different colors (e.g., red, green and blue) may be compounds containing an arylamine group.

In other embodiments, the plurality of light emitting units may further include a third light emitting unit. The wavelength of the light emitted by the second light emitting unit is less than the wavelength of the light emitted by the third light emitting unit. For example, the third light emitting unit may be a red light emitting unit. The hole mobility of a region corresponding to the third light emitting unit of the electron blocking layer 13 is the fourth hole mobility, the ratio of the fourth hole mobility to the first hole mobility is the third ratio, and the second ratio is greater than the third ratio. The requirements for the mobility of the electron blocking layer 13 corresponding to the light emitting units of different colors are different. By setting different hole mobility in different regions of the electron blocking layer 13, the voltage of the light emitting units of different colors can be optimized while further improving the color lateral crosstalk, thereby preventing the voltage from being too high, and keeping the voltage of the light emitting device stable.

In some embodiments, the first ratio A1 can be greater than 1 and less than or equal to 100, the second ratio A2 can be greater than 1 and less than or equal to 11, and the third ratio A3 can be in a range from 1 to 10. Optionally, the first ratio A1 may be in a range from 50 to 100, and the second ratio A2 may be in a range from 2 to 8, and the third ratio A3 may be in a range from 2 to 8. Further optionally, the first ratio A1 may be in a range from 55 to 95, the second ratio may be in a range from 3 to 7, and the third ratio A3 may be in a range from 2.5 to 7. The specific ratio can be selected according to the actual situation. The material of the electron blocking layer 13 may be a compound containing an arylamine group. Optionally, the material of the electron blocking layer 13 corresponding to the light emitting devices emitting light with different colors (e.g., red, green and blue) may be compounds containing an arylamine group.

Optionally, the first light emitting unit has a blue light emitting material, the second light emitting unit has a green light emitting material, and the third light emitting unit has a red light emitting material.

In some embodiments, a hole mobility of the hole injection layer 11 and a hole mobility of the hole transport layer 12 may be both in a range from $5 \times 10^{-4}$ cm$^2$/Vs to $5 \times 10^{-5}$ cm$^2$/Vs, further optionally in a range from $4 \times 10^{-4}$ cm$^2$/Vs to $8 \times 10^{-5}$ cm$^2$/Vs.

According to some embodiments, the light emitting device may further include an electron transport layer 16 located between the light emitting layer 14 and the electron injection layer 17. According to other embodiments, the light emitting device may further include a hole blocking layer 15 located between the light emitting layer 14 and the electron transport layer 16. The light emitting device may further include an anode 10 and a cathode 18. The anode 10 is arranged on a side of the hole injection layer 11 away from the hole transport layer 12, and the cathode 18 is arranged on a side of the electron injection layer 17 away from the electron transport layer 16.

In the embodiment according to the present disclosure, the material of the hole injection layer 11 may be inorganic oxides, e.g., molybdenum oxides, titanium oxides, vanadium oxides, rhenium oxides, ruthenium oxides, chromium oxides, zirconium oxides, hafnium oxides, tantalum oxides, silver oxides, tungsten oxides and manganese oxides; or strong electron withdrawing system materials, e.g., hexacyanohexaazatriphenylene, 2,3,5,6-tetrafluoro-7,7,8,8-tetracyanoquinodimethane (F4TCNQ), 1,2,3-tri[(cyano)(4-cyano-2,3,5,6-tetrafluorophenyl)methylene]cyclopropane, and the like.

In the embodiment according to the present disclosure, the hole transport layer 12 and the electron blocking layer 13 may be made from arylamine or carbazole materials having hole transport properties, e.g., 4,4'-bis[N-(1-naphthyl)-N-phenylamino]biphenyl (NPB), N,N'-bis(3-methyllphenyl)-N,N'-diphenyl-(1,1'-biphenyl)-4,4'-diamine (TPD), 4-phenyl-4'-(9-phenylfluoren-9-yl)triphenylamine (BAFLP), 4,4'-bis[N-(9,9-dimethylfluoren-2-yl)-N-phenylamino]biphenyl (DFLDPBi), 4,4'-bis(9-carbazolyl)biphenyl (CBP), 9-phenyl-3-[4-(10-phenyl-9-anthryl)phenyl]-9H-carbazole (PCzPA), and the like.

In the embodiment according to the present disclosure, the light emitting layer 14 may include one material or a mixed material of two or more materials. The light emitting material can be classified into blue light emitting materials, green light emitting materials, and red light emitting materials. The blue light emitting material can be selected from pyrene derivatives, anthracene derivatives, fluorene derivatives, perylene derivatives, styrylamine derivatives, metal complexes, etc., for example, N1,N6-bis([1,1'-biphenyl]-2-yl)-N1,N6-bis([1,1'-biphenyl]-4-yl) pyrene-1,6-diamine, 9,10-bis(2-naphthyl)anthracene (ADN), 2-methyl-9,10-di-2-naphthylanthracene (MADN), 2,5,8,11-tetra-tert-butylperylene (TBPe), 4,4'-bis(4-(diphenylamino)styryl)biphenyl (BDAV Bi), 4,4'-bis[4-(di-p-tolylamino)styryl] biphenyl (DPAVBi), and bis(4,6-difluorophenylpyridine-C2,N)picolinatoiridium (Flrpic). The green light emitting material can be selected from coumarin dyes, quinacridone derivatives, polycyclic aromatic hydrocarbons, diamine anthracene derivatives, carbazole derivatives, metal complexes, etc., for example, coumarin 6(C-6), coumarin 545T (C-525T), quinacridone (QA), N,N'-dimethyl quinacridone (DMQA), 5,12-diphenyl naphthacin (DPT), N10,N10'-diphenyl-N10, N10'-diphthaloyl-9,9'-dianthracene-10,10'-diamine (BA-NPB), tris(8-hydroxyquinoline) aluminum (III) (Alq$_3$), tris (2-phenylpyridine) iridium (Ir(ppy)$_3$) and acetylacetonate bis(2-phenylpyridine)iridium (Ir(ppy)$_2$(acac)). The red light emitting material is selected from DCM series materials, metal complexes, etc., for example, 4-(dicyanomethylene)-2-methyl-6-(4-dimethylaminostyryl)-4H-pyran (DCM), 4-(dicyano-methylene)-2-tert-butyl-6-(1,1,7,7-tetramethyl-julonidine-9-enyl)-4H-pyran (DCJTB), bis(1-phenylisoquinoline) (acetylacetone) iridium (III) (Ir(piq)$_2$(acac)) and octaethylporphyrin platinum (PtOEP), bis(2-(2'-benzothienyl) pyridine-N,C3') (acetylacetone) iridium (Ir(btp)$_2$ (acac)).

In the embodiment according to the present disclosure, the hole blocking layer 15 and the electron transport layer 16 may be both made from aromatic heterocyclic compounds, including but not limited to, imidazole derivatives, such as benzimidazole derivatives, imidazole pyridine derivatives, and benzimidazole phenanthridine derivatives; pyrimidine derivatives; oxazine derivatives, such as triazine derivatives; compounds containing nitrogen-containing six-membered ring structure, such as quinoline derivatives, isoquinoline derivatives, phenanthroline derivatives; and compounds having phosphine oxide substituents on heterocycles. For example, there are 2-(4-biphenyl)-5-(4-tert-butylphenyl)-1, 3,4-oxadiazole (PBD), 1,3-bis[5-(p-tert-butylphenyl)-1,3,4-oxadiazol-2-yl)benzene (OXD-7), 3-(4-tert-butylphenyl)-4-phenyl-5-(4-biphenyl))-1,2,4-triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP), 4,4'-bis(5-methylbenzoxazol-2-yl) stilbene (BzOs), etc.

In an embodiment according to the present disclosure, the electron injection layer 17 may be made from alkali metals or metals, or compounds thereof, e.g., LiF, Yb, Mg, and Ca.

The square resistance of the P-doped hole injection material or hole transport material (HT material) can be designed as required. HT1 and HT2 represent a class of HT materials (at a condition of 10V), respectively. When the doping amount of the p-type dopant is 3 wt % and the thickness of the p-type doped HT material layer is 10 nm, the square resistance of the p-type doped HT1 material can be in a range from $1 \times 10^{10}$ Ω/sq to $5 \times 10^{10}$ Ω/sq, for example, the square resistance of HT1-a can be $3 \times 10^{10}$ Ω/sq, the square resistance of HT1-b can be $2.5 \times 10^{10}$ Ω/sq; the square resistance of p-type doped HT2 material can be in a range from $5 \times 10^{10}$ Ω/sq to $5 \times 10^{11}$ Ω/sq, for example, the square resistance of HT2-a can be $6.5 \times 10^{10}$ Ω/sq, the square resistance of HT2-b can be $3.5 \times 10^{11}$ Ω/sq, and the square resistance of HT2-c can be $2.7 \times 10^{11}$ Ω/sq. The square resistance of HT2-d can be $1.8 \times 10^{11}$ Ω/sq. The square resistance of the HT2 material can be 5 to 10 times the square resistance of the HT1 material. The hole mobility of the HT2 material may be less than the hole mobility of the conventional HT1 material. The square resistance (the p-type doping amount is 3 wt %, and the thickness of HT2 is 5 nm)/the square resistance (the p-type doping amount is 3 wt %, and the thickness of HT2 is 10 nm) can be in a range from 0.03 to 0.08.

Figure 1:
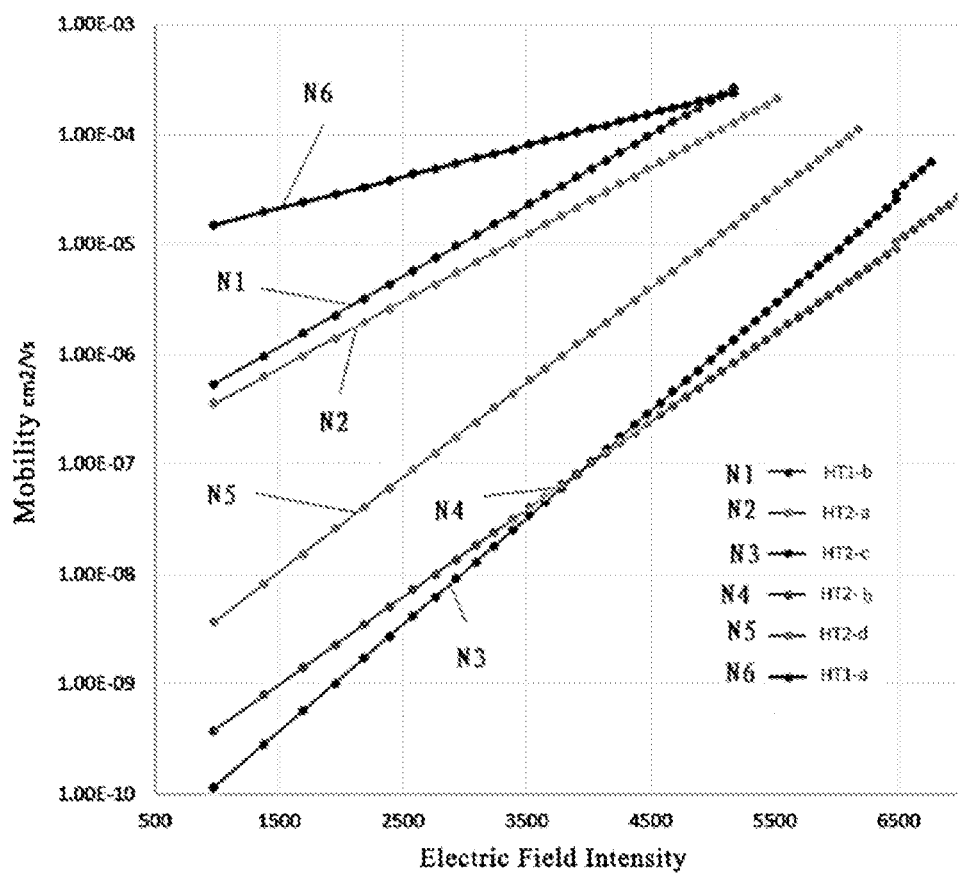
FIG. 1 shows mobility of different hole transport materials.

When the doping amount of the P-type dopant is 1 wt % and the thickness of the p-type doped HT material layer is 10 nm, the square resistance of the p-type doped HT1 material can be in a range from $3\times10^{10}$ Ω/sq to $8\times10^{10}$ Ω/sq, for example, the square resistance of HT1-a can be $4\times10^{11}$ Ω/sq, the square resistance of HT1-b can be $4.5\times10^{11}$ Ω/sq; the square resistance of p-type doped HT2 material can be in a range from $1\times10^{12}$ Ω/sq to $5\times10^{12}$ Ω/sq, for example, the square resistance of HT2-a can be $1.1\times10^{12}$ Ω/sq, the square resistance of HT2-b can be $4\times10^{12}$ Ω/sq, the square resistance of HT2-c can be $2.6\times10^{12}$ Ω/sq, and the square resistance of HT2-d can be $2\times10^{12}$ Ω/sq. The square resistance of the HT1 material is less than the square resistance of the HT2 material, and the square resistance of the HT2 material can be 5 to 10 times the square resistance of the HT1 material. The hole mobility of the HT2 material may be less than the hole mobility of the conventional HT1 material. The mobility of different HT materials can be shown in FIG. 1, and N1-N6 represent the mobility curves of different materials, and different square resistances can be achieved according to different doping ratios and specific thicknesses.

The following materials can be used to prepare the light emitting device, specifically as follows.

The hole injection layer is made from an HT material (m-MTDATA) doped with P-type dopant (F4TCNQ), and the structural formula of P-type dopant (F4TCNQ) is shown as follows.

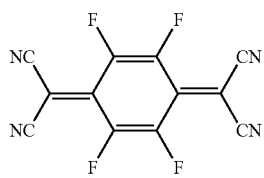

The structural formula of the HT material (m-MTDATA) is shown as follows.

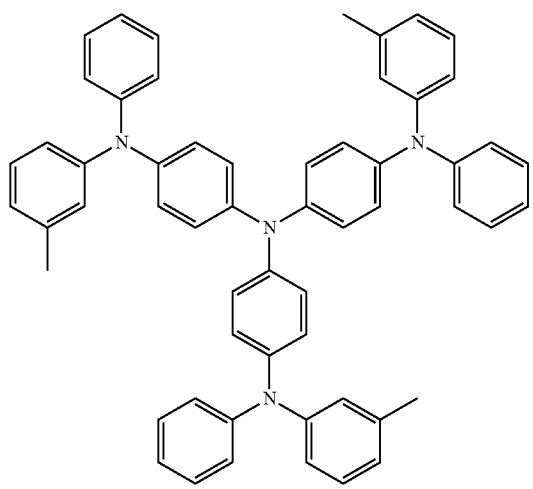 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]

The hole transport layer can be made from CBP, and the specific structural formula of CBP is shown as follows.

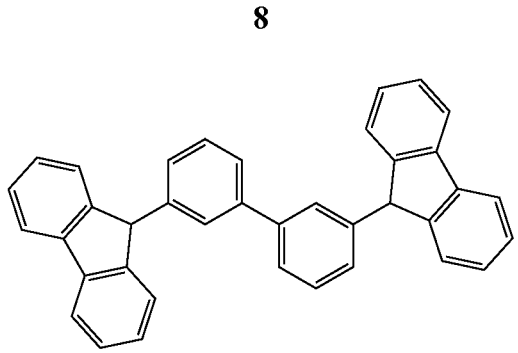

The hole blocking layer (HBL) is made from TPBi, and the specific structural formula of TPBi is shown as follows.

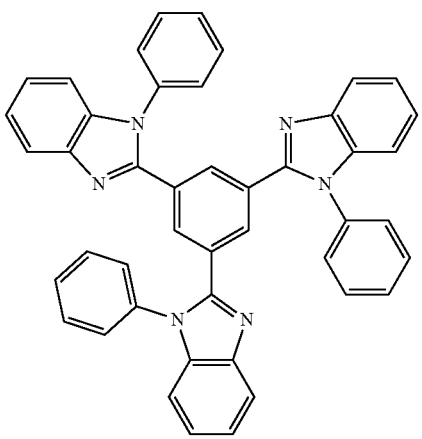 [SMILES: c1ccc(-n2c(-c3cc(-c4nc5ccccc5n4-c4ccccc4)cc(-c4nc5ccccc5n4-c4ccccc4)c3)nc3ccccc32)cc1]

The electron transport layer (ETL) is made from BCP, and the specific structural formula of BCP is shown as follows.

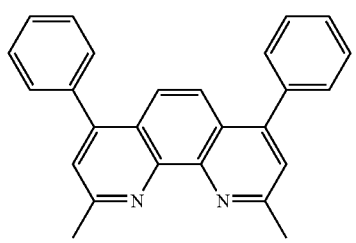 [SMILES: Cc1cc(-c2ccccc2)c2ccc3c(-c4ccccc4)cc(C)nc3c2n1]

The specific structural formula of the host material (BH) of the blue light emitting material is shown as follows.

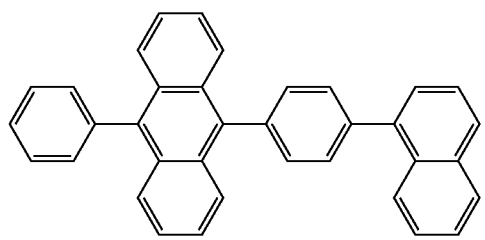 [SMILES: c1ccc(-c2c3ccccc3c(-c3ccc(-c4cccc5ccccc45)cc3)c3ccccc23)cc1]

The specific structural formula of the guest material (BD) of the blue light emitting material is shown as follows.

The guest material GD of the green light emitting material can be Ir(ppy)$_3$, and its specific structural formula is shown as follows.

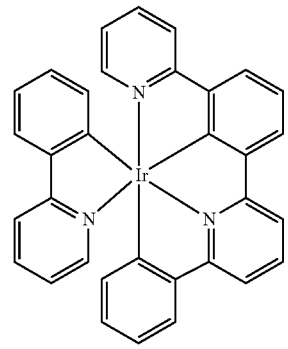

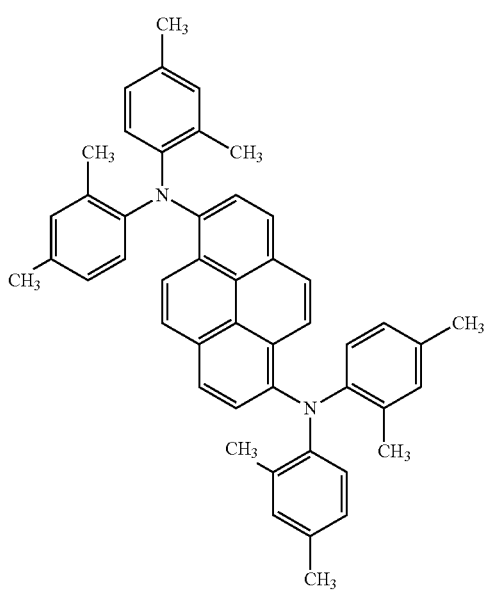

The host material GH/RH of the green or red luminescent material can be both made from CBP, and the specific structural formula of CBP is shown as follows.

The guest material RD of the red light emitting material can be Ir(piq)(acac), and its specific structural formula is shown as follows.

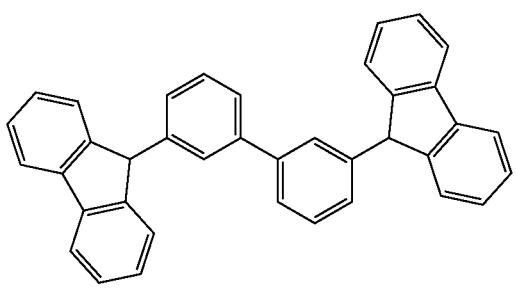 [SMILES: c1cc(-c2cccc(C3c4ccccc4-c4ccccc43)c2)cc(C2c3ccccc3-c3ccccc32)c1]

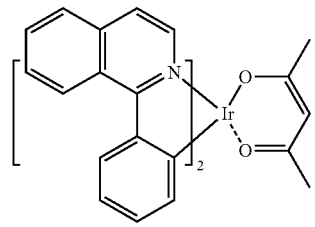

The light emitting devices of the example and the comparative example in the following Table 1 are used to test the phenomenon of RGB color crosstalk.

TABLE 1

| Structure of Device | Hole Injection Layer (HI) | Hole Transport Layer (HT) | Electron Blocking Layer (EBL) | Light Emitting Layer (EML) | Hole Blocking Layer (HBL) | Electron Transport Layer (ETL) | Electron Injection Layer (EIL) |
|---|---|---|---|---|---|---|---|
| Light Emitting Device of Comparative Example | HT1: 3% p-type doped, 10 nm thick | HT1, 90 nm thick | CBP, 10 nm thick (B); 35 nm thick (G); 80 nm thick (R); | BLUE: BH/BD, 20 nm; GREEN: GH/GD, 35 nm; RED: RH/RD, 45 nm | TPBI 5 nm thick | BCP: LIQ 30 nm thick | LIF 1 nm thick |
| Light Emitting Device of Example | HT2: 3% P-type doped, 10 nm thick | HT2, 90 nm | EBL: A1 = 59 EBL: A2 = 5 EBL: A3 = 2 | | | | |

Figure 3:
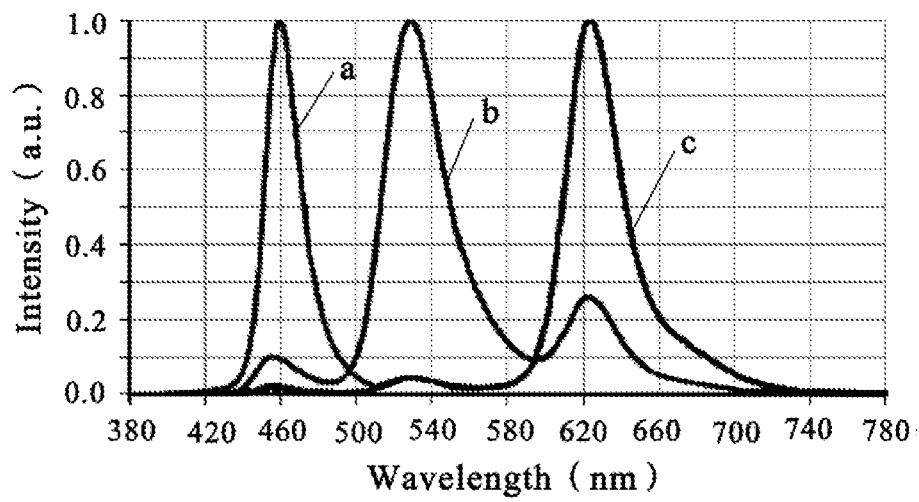
FIG. 3 is a spectrum diagram of a light emitting device according to an embodiment of the present disclosure.
Figure 4:
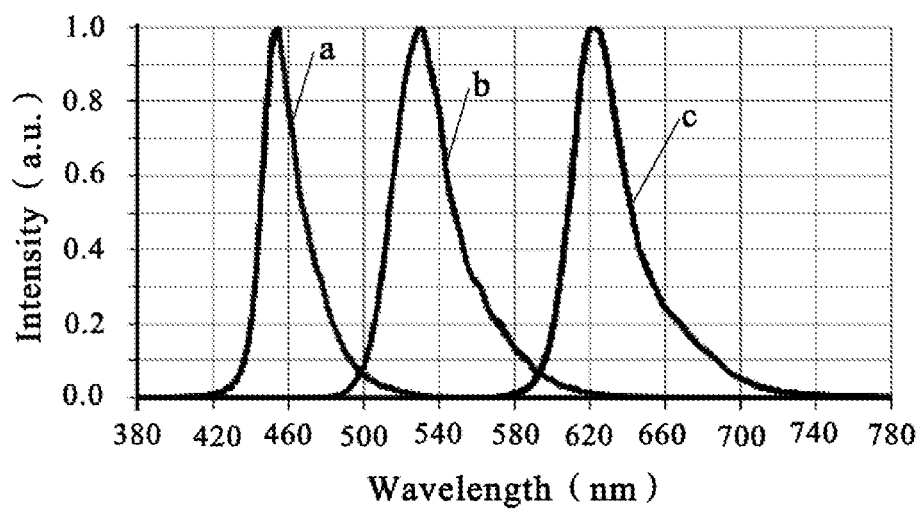
FIG. 4 is a spectrum diagram of a light emitting device according to a comparative example of the present disclosure.

A PR-680 spectral scanning colorimeter was used to test the luminescence spectrum of the light emitting device of the example and the comparative example. The luminescence spectrum test result of the light emitting device of the comparative example is shown in FIG. 3, curves a, b and c in FIG. 3 represent of luminescence spectrums of the Blue pixel, the Green pixel and Red pixel, respectively. The luminescence spectrum test result of the light emitting device of the example is shown in FIG. 4, curves a, b and c in FIG. 4 represent of luminescence spectrums of the Blue pixel, the Green pixel and Red pixel, respectively. As can be seen from the comparison of FIG. 3 and FIG. 4, the light emitting device of the comparative example does not use the p-type doping material HT2 with high square resistance, so the crosstalk occurs between the red pixel, the green pixel, and the blue pixel; while the light emitting device of the example of the present disclosure does not have such crosstalk phenomenon between the red pixel, the green pixel, and the blue pixel due to the use p-type doping material HT2 with the high square resistance and the reasonable setting of the ratio of the hole mobility of the region corresponding to the different pixels of RGB in the electron blocking layer to the hole mobility of the hole transport material. Therefore, the light emitting device according to the example of the present disclosure can solve the problem of color crosstalk between the light emitting units.

The light emitting device (blue light emitting device) in Table 2 is used to test the voltage, external quantum luminous efficiency (EQE) and life of the light emitting device. The test method is a test method commonly used in the field. The specific test results are shown in Table 3.

TABLE 2

| Structure of Device | Hole Injection Layer (HI) | Hole Transport Layer (HT) | Electron Blocking Layer (EBL) | Light Emitting Layer (EML) | Hole Blocking Layer (HBL) | Electron Transport Layer (ETL) | Electron Injection Layer (EIL) |
|---|---|---|---|---|---|---|---|
| Light Emitting Device of Comparative Example | HT1: 3% p-type doped, 10 nm thick | HT1 90 nm thick | CBP 10 nm thick | BH: BD 20 nm thick | TPBI 5 nm thick | BCP: LIQ 30 nm thick | LIF 1 nm thick |
| Light Emitting Device of Examples | HT2: 3% p-type doped, 10 nm thick | HT2 90 nm thick | EBL: A1 = 12 EBL: A1 = 37 EBL: A1 = 59 | | | | |

TABLE 3

| | Material | Voltage | EQE | Life(LT95@1000nit) |
|---|---|---|---|---|
| Comparing Device EBL:CBP | HT1-a | 100% | 100% | 100% |
| EBL:CBP, A1 < 1 | HT2-a | 101% | 99% | 100% |
| | HT2-b | 107% | 96% | 105% |
| | HT2-c | 105% | 98% | 103% |
| | HT2-d | 102% | 99% | 101% |
| EBL:A1 = 12 | HT2-a | 99% | 100% | 101% |
| | HT2-b | 102% | 98% | 102% |
| | HT2-c | 100% | 99% | 101% |
| | HT2-d | 99% | 100% | 100% |
| EBL:A1 = 37 | HT2-a | 97.5% | 101% | 104% |
| | HT2-b | 100% | 99% | 105% |
| | HT2-c | 99% | 100% | 103% |
| | HT2-d | 98% | 102% | 100% |
| EBL:A1 = 59 | HT2-a | 95% | 105% | 109% |
| | HT2-b | 99% | 102% | 111% |
| | HT2-c | 98% | 101% | 107% |
| | HT2-d | 97.5% | 107% | 103% |

As can be seen from the test results in Table 3, the use of high-resistance HT2 as the constituent material of the hole transport layer and the hole injection layer improves or reduces the lateral current; further the mobility ratio between the HT2 material and the electron blocking layer material is optimized, that is, the hole mobility of the electron blocking layer is greater than the hole mobility of the hole injection layer and the hole transport layer, thereby further improving or reducing the lateral HT current while maintaining the vertical voltage stability, and improving the performance of light emitting devices.

The embodiments of the present disclosure further provide a display substrate, including the light emitting device described in the above embodiments. Similarly, the display substrate of the embodiment of the present disclosure can solve the problem of color crosstalk between the light emitting units, ensure voltage stability, and enhance the display effect.

An embodiment of the present disclosure provides a display equipment, including the display substrate as described in the above embodiment. Similarly, the display equipment of the embodiment of the present disclosure can solve the problem of color crosstalk between the light emitting units, ensure voltage stability, and enhance the display effect.

The embodiments of the present disclosure have been described above with reference to the accompanying drawings, but the present disclosure is not limited to the above specific embodiments, and the above specific embodiments are merely illustrative, and not restrictive. Without departing from the scope of the present disclosure and the scope of protection of the claims, a person skilled in the art can made many variations in light of the present disclosure, all of which fall into the protection of the present disclosure.

What is claimed is:

1. A light emitting device, comprising a hole injection layer, a hole transport layer, an electron blocking layer, a light emitting layer and an electron injection layer that are stacked in sequence,
wherein the light emitting layer comprises a plurality of light emitting units, and wavelengths of lights emitted by at least two of the plurality of light emitting units are different from each other;
wherein a hole mobility of the electron blocking layer is greater than or equal to a hole mobility of the hole injection layer or the hole transport layer;
wherein a square resistance of the hole injection layer and a square resistance of the hole transport layer are both in a range from $5 \times 10^{10}$ Ω/sq to $5 \times 10^{11}$ Ω/sq,
wherein the plurality of light emitting units comprises a first light emitting unit and a second light emitting unit, and a wavelength of the light emitted by the first light emitting unit is less than a wavelength of the light emitted by the second light emitting unit;
wherein the hole mobility of the hole injection layer is equal to the hole mobility of the hole transport layer and is the first hole mobility, a hole mobility of a region of the electron blocking layer corresponding to the first light emitting unit is a second hole mobility, a hole mobility of a region of the electron blocking layer corresponding to the second light emitting unit is a third hole mobility, a ratio of the second hole mobility to the first hole mobility is a first ratio, a ratio of the third hole mobility to the first hole mobility is a second ratio, and the first ratio is greater than the second ratio;
wherein the plurality of light emitting units further comprises a third light emitting unit, and the wavelength of the light emitted by the second light emitting unit is less than a wavelength of the light emitted by the third light emitting unit; and
wherein a hole mobility of a region of the electron blocking layer corresponding to the third light emitting unit is a fourth hole mobility, a ratio of the fourth hole mobility to the first hole mobility is a third ratio, and the second ratio is greater than the third ratio.

2. The light emitting device of claim 1, wherein the square resistance of the hole injection layer and the square resistance of the hole transport layer are both in a range from $5 \times 10^{10}$ Ω/sq to $2 \times 10^{11}$ Ω/sq.

3. The light emitting device of claim 1, wherein the first ratio is greater than 1 and less than or equal to 100, and the second ratio is greater than 1 and less than or equal to 11.

4. The light emitting device of claim 3, wherein the first ratio is in a range from 50 to 100, and the second ratio is in range from great than 2 to 10.

5. The light emitting device of claim 1, wherein the first ratio is greater than 1 and less than or equal to 100, the second ratio is greater than 1 and less than or equal to 11, and the third ratio is in a range from 1 to 10.

6. The light emitting device of claim 5, wherein the first ratio is in a range from greater than 50 to 100, the second ratio is in a range from 2 to 10, and the third ratio is in a range from 2 to 8.

7. The light emitting device of claim 1, wherein the first light emitting unit has a blue light emitting material, the second light emitting unit has a green light emitting material, and the third light emitting unit has a red light emitting material.

8. The light emitting device of claim 1, wherein the hole mobility of the hole injection layer and the hole mobility of the hole transport layer are both in a range from $5 \times 10^{-4}$ cm$^2$/Vs to $5 \times 10^{-5}$ cm$^2$/Vs.

9. The light emitting device of claim 1, further comprising an electron transport layer located between the light emitting layer and the electron injection layer.

10. The light emitting device of claim 9, further comprising a hole blocking layer located between the light emitting layer and the electron transport layer.

11. A display substrate, comprising the light emitting device of claim 1.

12. The display substrate of claim 11, wherein the first ratio is greater than 1 and less than or equal to 100, and the second ratio is greater than 1 and less than or equal to 11.

13. The display substrate of claim 12, wherein the first ratio is in a range from 50 to 100, and the second ratio is in range from great than 2 to 10.

14. The display substrate of claim 11, wherein the first ratio is greater than 1 and less than or equal to 100, the second ratio is greater than 1 and less than or equal to 11, and the third ratio is in a range from 1 to 10.

15. The display substrate of claim 14, wherein the first ratio is in a range from greater than 50 to 100, the second ratio is in a range from 2 to 10, and the third ratio is in a range from 2 to 8.

16. A display equipment, comprising the display substrate of claim 11.

17. The display substrate of claim 11, wherein the first light emitting unit has a blue light emitting material, the second light emitting unit has a green light emitting material, and the third light emitting unit has a red light emitting material.

18. The display substrate of claim 11, wherein the hole mobility of the hole injection layer and the hole mobility of the hole transport layer are both in a range from $5 \times 10^{-4}$ cm$^2$/Vs to $5 \times 10^{-5}$ cm$^2$/Vs.

19. The display substrate of claim 11, further comprising an electron transport layer located between the light emitting layer and the electron injection layer.

20. The display substrate of claim 19, further comprising a hole blocking layer located between the light emitting layer and the electron transport layer.

* * * * *